(12) United States Patent
Lu et al.

(10) Patent No.: US 9,082,870 B2
(45) Date of Patent: Jul. 14, 2015

(54) METHODS AND APPARATUS OF PACKAGING SEMICONDUCTOR DEVICES

(71) Applicant: Taiwan Semiconductor Manufacturing Company, Ltd., Hsin-Chu (TW)

(72) Inventors: Chun-Lin Lu, Hsin-Chu (TW);
Hsien-Wei Chen, Hsin-Chu (TW);
Kai-Chiang Wu, Hsin-Chu (TW);
Hung-Jui Kuo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/900,754

(22) Filed: May 23, 2013

(65) Prior Publication Data
US 2014/0264824 A1    Sep. 18, 2014

Related U.S. Application Data

(60) Provisional application No. 61/779,663, filed on Mar. 13, 2013.

(51) Int. Cl.
*H01L 23/00* (2006.01)
*H01L 23/31* (2006.01)
*H01L 23/525* (2006.01)
*H01L 23/532* (2006.01)

(52) U.S. Cl.
CPC ............ *H01L 24/81* (2013.01); *H01L 23/3114* (2013.01); *H01L 23/5329* (2013.01); *H01L 23/525* (2013.01); *H01L 23/53223* (2013.01); *H01L 23/53238* (2013.01); *H01L 23/53266* (2013.01)

(58) Field of Classification Search
CPC ............ H01L 2924/00; H01L 2224/97; H01L 2224/05166; H01L 24/11; H01L 2225/06513; H01L 25/50; H01L 23/3114; H01L 21/823814; H01L 2224/0391
See application file for complete search history.

(56) References Cited

U.S. PATENT DOCUMENTS

| | | | | |
|---|---|---|---|---|
| 6,362,087 | B1 * | 3/2002 | Wang et al. | 438/597 |
| 6,440,865 | B1 * | 8/2002 | Lee | 438/714 |
| 6,737,345 | B1 * | 5/2004 | Lin et al. | 438/601 |
| 6,917,119 | B2 * | 7/2005 | Lee et al. | 257/780 |
| 7,229,846 | B2 * | 6/2007 | Feng | 438/26 |
| 7,642,128 | B1 * | 1/2010 | Lin et al. | 438/106 |
| 7,709,839 | B2 * | 5/2010 | Kim et al. | 257/59 |
| 7,728,419 | B2 * | 6/2010 | Lee et al. | 257/690 |
| 8,004,092 | B2 * | 8/2011 | Lin et al. | 257/781 |
| 8,097,491 | B1 * | 1/2012 | Hsu et al. | 438/106 |
| 8,168,470 | B2 * | 5/2012 | Lin et al. | 438/107 |
| 8,318,540 | B2 * | 11/2012 | Beer | 438/113 |
| 8,319,354 | B2 * | 11/2012 | Lin et al. | 257/781 |

(Continued)

*Primary Examiner* — Evan Pert
*Assistant Examiner* — Gustavo Ramallo
(74) *Attorney, Agent, or Firm* — Slater & Matsil, L.L.P.

(57) ABSTRACT

Methods and apparatus are disclosed which reduce the stress concentration at the redistribution layers (RDLs) of a package device. A package device may comprise a seed layer above a passivation layer, covering an opening of the passivation layer, and covering and in contact with a contact pad. A RDL is formed above the passivation layer, above and in contact with the seed layer, covering the opening of the passivation layer, and electrically connected to the contact pad through the seed layer. The RDL has an end portion with a surface that is smooth without a right angle. The surface of the end portion of the RDL may have an obtuse angle, or a curved surface.

20 Claims, 4 Drawing Sheets

(56) References Cited

U.S. PATENT DOCUMENTS

| | | | |
|---|---|---|---|
| 8,558,229 B2* | 10/2013 | Jeng et al. | 257/48 |
| 2013/0087892 A1* | 4/2013 | Yew et al. | 257/621 |
| 2013/0280826 A1* | 10/2013 | Scanlan et al. | 438/15 |
| 2014/0167253 A1* | 6/2014 | Tseng et al. | 257/737 |

* cited by examiner

METHODS AND APPARATUS OF PACKAGING SEMICONDUCTOR DEVICES

This application claims the benefit of U.S. Provisional Application No. 61/779,663 filed on Mar. 13, 2013, entitled "Methods and Apparatus of Packaging Semiconductor Devices," which application is hereby incorporated herein by reference.

BACKGROUND

Semiconductor devices are used in a variety of applications, such as personal computers, cell phones, digital cameras, and other electronic equipment. Semiconductor devices can be divided into a simple hierarchy consisting of devices such as integrated circuit (IC) dies, packages, printed circuit boards (PCB), and systems. The package is the interface between an IC die and a PCB. IC dies are made from semiconductor materials such as silicon. Dies are then assembled into a package. The packaged die is then attached either directly to a PCB or to another substrate, which is defined as the second level packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past. Some smaller types of packages for semiconductor devices include quad flat pack (QFP), pin grid array (PGA), ball grid array (BGA), flip chips (FC), three dimensional integrated circuits (3DIC), wafer level packages (WLP), wafer-level chip scale packages (WLCSP), and package on package (PoP) devices.

In a typical manufacturing process, active and passive devices may be made within a substrate, and connected by interconnect structures such as metal contacts formed on metallization layers and dielectric layers. Contact pads are formed above the metallization layers to make connections to packages. Typically, redistribution layers (RDLs) or post-passivation interconnects (PPI) may be used to fan out wires for contact pads, followed by the formation of UBM pads connected to RDLs, and solder balls on the UBM pads to establish electrical contacts between contact pads of a chip such as input/output pads and the substrate or lead frame of the package.

The package structure produced by the typical manufacturing process is found to have the passivation layer delamination issue caused by the stress concentration at the RDLs. Methods and apparatus are needed to reduce the stress concentration at the RDLs to solve the passivation layer delamination issue for packages.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

Methods and apparatus are disclosed which reduce the stress concentration at the redistribution layers (RDLs) of a package device and reduce the passivation layer delamination for packages. A package device may comprise a seed layer above a passivation layer, covering an opening of the passivation layer, and covering and in contact with a contact pad. A RDL is formed above the passivation layer, above and in contact with the seed layer, covering the opening of the passivation layer, and electrically connected to the contact pad through the seed layer. The RDL has an end portion with a surface that is smooth without a right angle. The surface of the end portion of the RDL may have an obtuse angle, or a curved surface. Such a smooth surface of the end portion of the RDL can reduce the stress concentration at the RDL, compared to the conventional surface with a right angle at the end portions of the RDL. The reliability of the package device, on the other hand, is improved.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1(a)-1(d) illustrate in cross sectional views a package device 100. The package device 100 comprises a substrate 101, an active device 102 within the substrate 101, and a contact pad 105 on the substrate 101, which may be a part of an integrated circuit (IC) contained within the package 100. A passivation layer 103 covers the substrate 101 with an opening exposing the contact pad 105. A first insulating layer 107 is formed above the passivation layer 103 and has an opening exposing the contact pad 105. A seed layer 109 is formed above and in contact with the first insulating layer 107, covering the opening of the first insulating layer 107 and in contact with the contact pad 105. A post-passivation interconnect (PPI) line 111, which may be called a redistribution layer (RDL) 111, is formed above and in contact with the seed layer 109, following the contour of the seed layer 109 and covering the contact pad 105. Another insulating layer 113 is formed on the first insulating layer 107, covering the RDL 111 and the seed layer 109. The insulating layer 113 has an opening where an an external connector such as a solder ball (not individually illustrated) along with an optional under bump metallization (UBM) pad 115 is located. Each component is described in more details below.

As illustrated in FIGS. 1(a)-1(d), the device 100 may be formed on a substrate 101 which is made of silicon or other bulk semiconductor material. The device 100 may be a part of a base semiconductor wafer, which contains additional semiconductor IC not shown. The device 100 may contain active and passive devices, such as an active device 102, conductive layers, and dielectric layers according to the electrical design of the circuit. The device 100 is only illustrated for one contact pad 105 through a RDL 111. The device 100 may comprise a plurality of contact pads connected through a network of RDLs according to its functional design. The electrical signals from the device 100 are routed through the network of RDLs to one or more of the solder bumps on the UBMs according to the function of the semiconductor device.

The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The substrate 101 may comprise active devices 102 such as transistors, shallow trench isolation (STI) regions, and other passive devices.

A conductive layer is formed as a contact pad 105 using a patterning and deposition process. The device 100 may have a plurality of contact pads 105 on a surface thereof. The contact pad 105 may be made with aluminum (Al), copper (Cu), tin (Sn), nickel (Ni), gold (Au), silver (Ag), or other electrically conductive material. The deposition of the contact pad 105 uses an electrolytic plating or electroless plating process. The size, shape, and location of the contact pad 105 are only for illustration purposes and are not limiting. The plurality of contact pads of the device 100, which are not shown, may be of the same size or of different sizes.

A passivation layer 103, which may be a dielectric layer, may be formed over the surface of the substrate 101 and on top of the contact pad 105 for structural support and physical isolation. The passivation layer 103 can be made with silicon nitride (SiN), silicon dioxide (SiO2), silicon oxynitride (SiON), polyimide (PI), benzocyclobutene (BCB), polybenzoxazole (PBO), or other insulating material. An opening of the passivation layer 103 may be made by removing a portion of passivation layer 103 using a mask-defined photoresist etching process to expose a portion of the contact pad 105 while still covering other portion of the contact pad 105. The passivation layer 103 may have a thickness in a range larger than about 5 μm, such as in a range from about 5 μm to about 20 μm. The size, shape, and location of the opening made are only for illustration purposes and are not limiting.

A first insulating layer 107 may be formed on the passivation layer 103, following the contour of the passivation layer 103, filling a part of the opening of the passivation layer 103 over the contact pad 105. The first insulating layer 107 may not completely fill the opening of the passivation layer 103 over the contact pad 105, instead it may be patterned to form an opening to expose a part of the contact pad 105, while covering the rest of the contact pad 105. The patterning of the first insulating layer 107 may include photolithography techniques. The first insulating layer 107 may be formed of a polymer, such as an epoxy, polyimide, benzocyclobutene (BCB), polybenzoxazole (PBO), and the like, although other relatively soft, often organic, dielectric materials can also be used. Formation methods include spin coating or other commonly used methods. The thickness of the first insulating layer 107 may be between about 5 μm and about 30 μm, for example. The dimensions recited throughout the description are merely examples, and will change with the down-scaling of integrated circuits.

A seed layer 109 is formed above and in contact with the first insulating layer 107, covering the opening of the first insulating layer 107 and in contact with the contact pad 105. The seed layer 109 may be formed of a conductive material such as Cu, Ti, TiN, Ta, TaN, Cr, CrN, W, WN, or some other conductive materials, using a physical vapor deposition (PVD) or a chemical vapor deposition (CVD) process. The seed layer 109 may have a thickness in a range about 10 to 700 angstroms (Å) and possibly in a range about 50 to 300 Å. The seed layer 109 may be a substantially conformal layer, wherein the thickness of the portion of the seed layer 109 on the first insulating layer 107 or on the passivation layer 103 is substantially equal to the thickness of the vertical portion of the seed layer 109 on the sidewall of the opening of the first insulating layer 107 or of the passivation layer 103, and the thickness of the seed layer 109 within the opening of the first insulating layer 107 covering the contact pad.

A RDL 111 is formed above and in contact with the seed layer 109, following the contour of the seed layer 109 and covering the contact pad 105. The RDL 111 may be made with, e.g., Ti, Al, Ni, nickel vanadium (NiV), Cu, or a Cu alloy. The formation methods include electrolytic plating, electroless plating, sputtering, CVD methods, PVD methods, and the like. The RDL 111 can be made with a single layer, or multiple layers using an adhesion layer of Ti, TiW, or Cr, for example. The RDL 111 may be a substantially conformal layer, wherein the thickness of the portion of the RDL 111 on the seed layer 109 over the first insulating layer 107 is substantially equal to the thickness of the vertical portion of the RDL 111 on the sidewall of the opening of the first insulating layer 107, and the thickness of the RDL 111 within the opening of the first insulating layer 107 covering the contact pad 105. Alternatively, the RDL may have a flat surface and therefore not a conformal layer. The RDL 111 may have a height between about 2 μm and about 10 μm, or in a range of 0.5 KA to 3 KA, for example. The height of the RDL 111 is only shown for illustrative purposes and not limiting.

The seed layer 109 and the RDL 111 over the first insulating layer 107 may have a narrow, wide, or tapered shape (when viewed in cross section), may be of a substantially constant width and length.

As illustrated in FIGS. 1(a)-1(d), the RDL 111 is above the seed layer 109. The end portions 209 and 211 of the RDL 111 have a top surface that is smooth without a right angle. A smooth top surface of the end portions 209 and 211 of the RDL 111 may have various forms as illustrated in FIGS. 1(a)-1(d). There may be many other ways to form an end portion with a top surface that is smooth without a right angle for the RDL 111 besides those shown in FIGS. 1(a)-1(d), which are all intended to be included in the scope of the current disclosure.

Figure 1A:
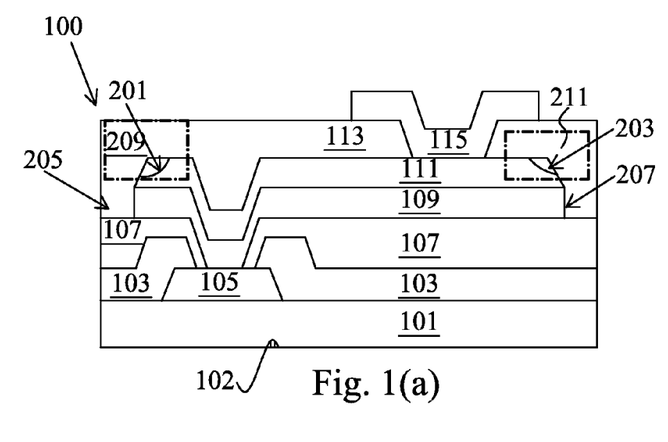
FIGS. 1(a)-1(d) illustrate in cross-sectional views a semiconductor package device in accordance with some embodiments.

For example, as illustrated in FIG. 1(a), a top surface of the end portion 209 has an obtuse angle 201 instead of a right angle as it conventionally has. A similar obtuse angle 203 is formed at the top surface of another end portion 211 of the RDL 111. The angle 201 and 203 may be of a similar degree or of different degrees, and may have a range of degrees in different embodiments. For example, in some embodiments the obtuse angle 201 and the obtuse angle 203 may be in a range of between about 91° and about 95°, while in other embodiments the obtuse angle 201 and the obtuse angle 203 may be in a range of between about 96° to about 100°, or about 101° to about 105°, or even about 106° to about 120°.

Figure 1B:
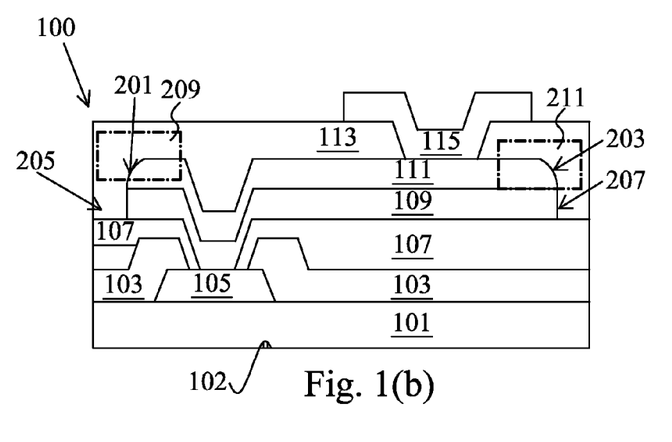

Alternatively, in another embodiment as illustrated in FIG. 1(b), the end portions 209 and 211 of the RDL 111 may have a smooth corner with curved surfaces 201 and 203 respectively. Both embodiments shown in FIGS. 1(a)-1(b) are examples of the end portions of the RDL 111 have a top surface that is smooth without a right angle.

Figure 1C:
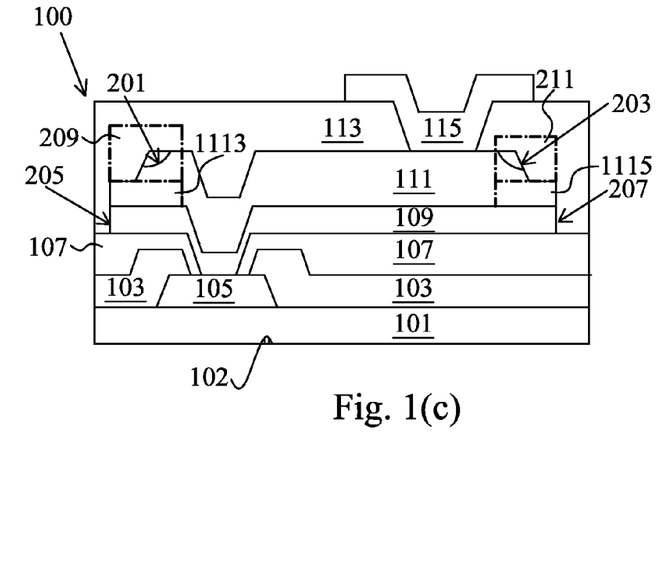
Figure 1D:
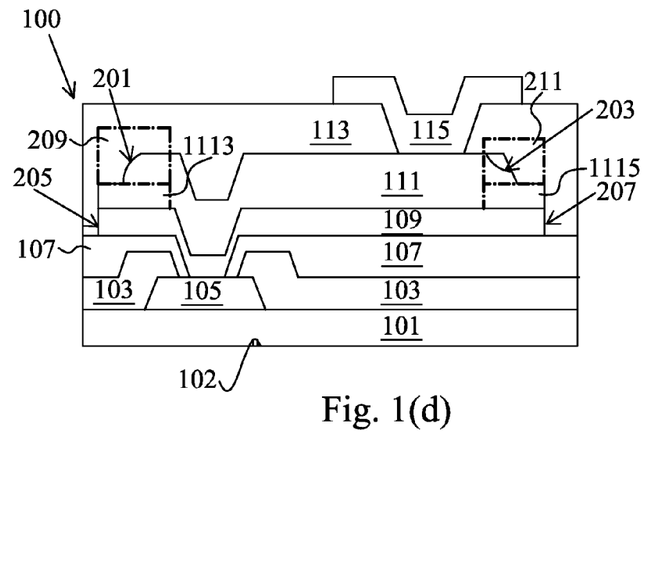

Still alternatively, as shown in FIG. 1(c), the RDL 111 may comprise two parts at an end portion, the end part 209 and the end part 1113 of the RDL 111 at one end above the seed layer 109. The end part 1113 is above and in contact with the seed layer 109, while the edge of the end part 1113 is substantially aligned with the edge of the seed layer 109. The end part 209 is above the end part 1113, and may be narrower than the end part 1113 so that a part of a surface of the end part 1113 is not covered by the end part 209. The end part 1113 may have a smooth top surface or a normal rectangle surface with a right angle. The end part 209 may have a top surface that is smooth without a right angle. For example, the end part 209 may have a top surface comprising an obtuse angle 201 as shown in FIG. 1(c), or with a curved surface 201 as shown in FIG. 1(d).

Similarly, as shown in FIG. 1(c), another end portion of the RDL 111 comprises two parts, the end part 211 and the end part 1115 of the RDL 111 above the end 207 of the seed layer 109. The end part 1115 is above and in contact with the seed layer 109, while the edge of the end part 1115 is substantially aligned with the edge of the seed layer 109. The end part 211 is above the end part 1115, and may be narrower than the end part 1115 so that a part of a surface of 1115 is not covered by the end part 211. The two parts 211 together form a stepwise shape for the end portion of the RDL 111. The end part 1115 may have a smooth top surface or a normal rectangle surface with a right angle. The end part 211 may have a top surface that is smooth without a right angle. For example, the end part 211 may have a top surface with an obtuse angle 203 as shown in FIG. 1(c) and as shown in FIG. 1(d). The smooth shape of one end part 211 may be independent from the smooth shape of another end part 209. For example, as illustrated in FIG. 1(d), the end part 211 has a top surface with an obtuse angle 203, while the end part 209 has a curved surface.

The embodiments of the package device 100 shown in FIGS. 1(a)-1(d) have a RDL 111 with end portions having a top surface that is smooth without a right angle. Such smooth top surface of the end portions of the RDL 111 has some advantageous features so that stress concentration at the RDL 111 can be reduced, compared to the conventional top surface with a right angle at the end portions of the RDL 111. The reliability of the package device 100, on the other hand, is improved.

As illustrated in FIGS. 1(a)-1(d), another insulating layer 113 is formed on the first insulating layer 107, covering the RDL 111 and the seed layer 109. The insulating layer 113 has an opening, which may be made using photolithography techniques. The insulating layer 113 may be formed of a polymer, such as an epoxy, polyimide, benzocyclobutene (BCB), polybenzoxazole (PBO), and the like, although other relatively soft, often organic, dielectric materials can also be used. Formation methods include spin coating or other commonly used methods. The thickness of the insulating layer 113 may be between about 5 μm and about 30 μm, for example.

The insulating layer 113 has an opening where an under bump metallization (UBM) pad 115 is located. A solder ball may be placed on the UBM pad 115, which is not shown. The UBM pad 115 may be formed in electrical contact with the RDL 111. The UBM pad 115 may comprise a layer of conductive material, such as a layer of titanium, or a layer of nickel. The UBM pad 115 may comprise multiple sub-layers, not shown. Any multiple layers made of materials such as titanium (Ti), titanium oxide (TiOx), tantalum (Ta), tantalum nitride (TaN), nickel (Ni), or copper (Cu), are suitable for the formation of the UBM pad 115. Any suitable materials or layers of material that may be used for the UBM pad 115 are fully intended to be included within the scope of the current embodiments. The UBM pad 115 may be created using processes such as sputtering, evaporation, or CVD process, depending upon the desired materials. The UBM pad 115 may be formed to have a thickness of between about 0.01 μm and about 10 μm, such as about 5 μm. Alternatively, the UBM pad 115 may not needed in some embodiment.

In addition, an electrically conductive solder material may be deposited over the UBM pad 115, which is not shown. The solder material can be any metal or electrically conductive material, e.g., Sn, lead (Pb), Ni, Au, Ag, Cu, bismuthinite (Bi) and alloys thereof, or mixtures of other electrically conductive material. In some embodiments, a solder ball may be mounted on the UBM pad 115.

The embodiment shown in FIG. 1(a) can be made by a process shown in FIGS. 2(a)-2(e) in cross-sectional views. Other embodiments can be made by similar processes, which are not shown.

Figure 2A:
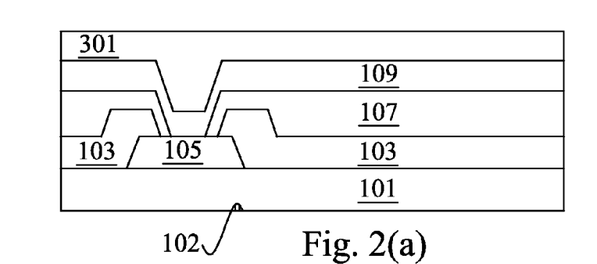
FIGS. 2(a)-2(e) illustrate in cross-sectional views a process of forming a semiconductor package device in accordance with some embodiments.

As illustrated in FIG. 2(a), a substrate 101 is provided with an active device 102 within the substrate 101 and a contact pad 105 on a surface of the substrate 101. A passivation layer 103 is formed on the surface of the substrate 101 with an opening exposing the contact pad 105. A first insulating layer 107 is formed above the passivation layer 103 and has an opening exposing the contact pad 105. A seed layer 109 is formed above and in contact with the first insulating layer 107, covering the opening of the first insulating layer 107 and in contact with the contact pad 105. The seed layer 109 may be formed with a conductive material selected from the group consisting essentially of Cu, Al, Ti, TiN, Ta, TaN, Cr, CrN, W, WN, and combinations thereof. Furthermore, a photoresist layer 301 may be formed above the seed layer 109 by depositing a photoresist material above the seed layer 109.

Figure 2B:
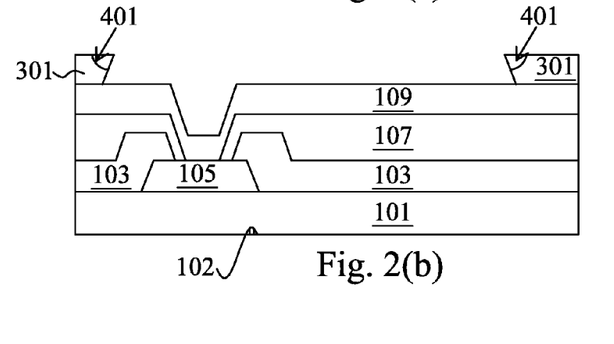

Photoresist layer 301 is a polymeric coating that is designed to change properties upon exposure to light. Then, either the exposed or unexposed regions of the coating can be selectively removed to reveal the surface beneath. As illustrated in FIG. 2(b), a part of the photoresist layer 301 may be removed to form a photoresist pattern 301 above the seed layer 109. The material for the photoresist layer 301 may comprise some photo active compound (PAC). PAC is a special kind of polymer. The role of the PAC is to inhibit the dissolution of the resist material in the developer. PACs are often diazoquinones, which are insoluble in typical developers. When the photoresist layer 301 is exposed to light, the light incident on the photoresist layer 301 is primarily absorbed by the PAC component of the photoresist layer 301, when the diazoquinone molecules of the PAC component chemically change. The unexposed regions of the resist are essentially unaffected by the developer. The PAC can be uniformly distributed through the resist, or can be controlled to create a sloped edged on the resist. The photoresist pattern 301 may cover the two ends of the seed 109, leaving the rest of the seed layer 109 uncovered. The photoresist pattern 301 may comprise a surface with an acute angle 401 as shown in FIG. 2(b). The acute angle 401 may be formed by changing the light intensity above the surface of the PR 301. For example, the light intensity close to the corner of the acute angle 401, may be higher than the light intensity close the bottom of the acute angle 401. The higher intensity light may remove more PR material mixed with the PAC, compared to the lower intensity light. Therefore, acute angle 401 is formed. Other shapes such as a curve shape may be formed as well by changing and programming the light intensity at the various points along the curved surface.

Figure 2C:
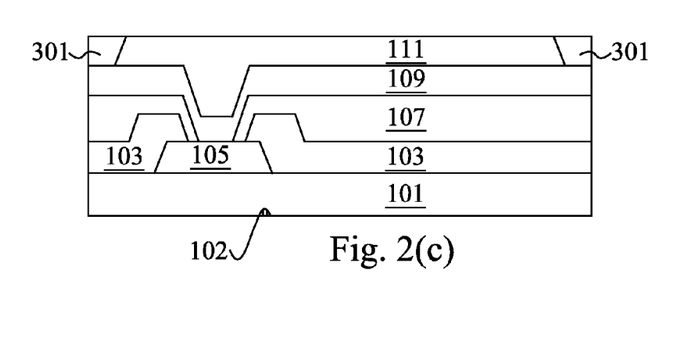

As illustrated in FIG. 2(c), a conductive material may be deposited above and in contact with the seed layer 109 in an area uncovered by the photoresist pattern 301 to form a RDL 111. The RDL 111 covers the opening of the passivation layer, and electrically connected to the contact pad 105 through the seed layer 109. The RDL 111 may be formed with a conductive material selected from the group consisting essentially of Ti, Al, Ni, nickel vanadium (NiV), Cu, a Cu alloy, and combinations thereof.

Figure 2D:
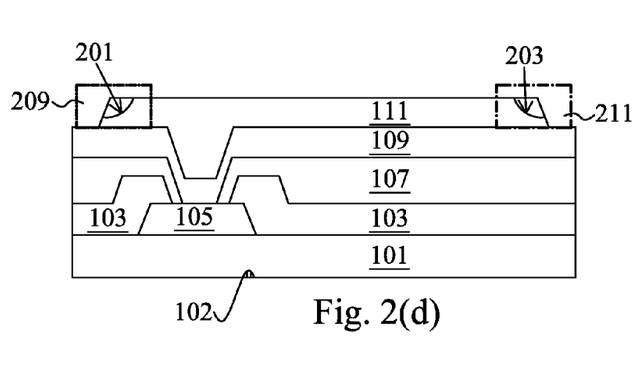

As illustrated in FIG. 2(d), the photoresist pattern 301 may be removed. The RDL 111 has an end portion 209 and an end portion 211 which were next to the photoresist pattern 301. Since the photoresist pattern 301 has an acute angle 401, the end portion 209 and the end portion 211 have a top surface with an obtuse angle 201 and 203 respectively. However, any other forms of top surface that is smooth without a right angle may be formed similarly, which are not shown in FIGS. 2(a)-2(e).

Figure 2E:
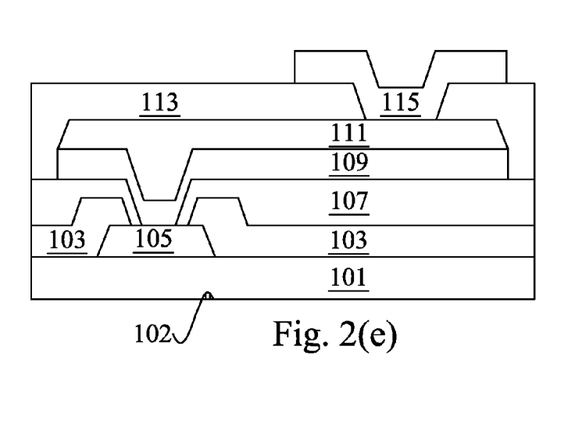

As illustrated in FIG. 2(e), a second insulating layer 113 may be formed above the RDL 111 after removing the photoresist pattern 301. An opening may be formed within the second insulating layer 113 to expose the RDL 111. Furthermore, an UBM pad 115 maybe formed within the opening of the second insulating layer 113 and in contact with the RDL 111.

As another example, the embodiment shown in FIG. 1(c) can be made by a process shown in FIGS. 3(a)-3(h) in cross-sectional views. Other embodiments can be made by similar processes, which are not shown.

Figure 3A:
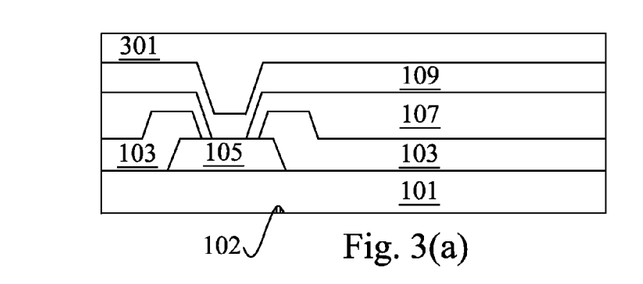
FIGS. 3(a)-3(h) illustrate in cross-sectional views another process of forming a semiconductor package device in accordance with some embodiments.

As illustrated in FIG. 3(a), a substrate 101 is provided with an active device 102 within the substrate 101 and a contact pad 105 on a surface of the substrate 101. A passivation layer 103 is formed on the surface of the substrate 101 with an opening exposing the contact pad 105. A first insulating layer 107 is formed above the passivation layer 103 and has an opening exposing the contact pad 105. A seed layer 109 is formed above and in contact with the first insulating layer 107, covering the opening of the first insulating layer 107 and in contact with the contact pad 105. Furthermore, a photoresist layer 301 may be formed above the seed layer 109 by depositing a photoresist material above the seed layer 109.

Figure 3B:
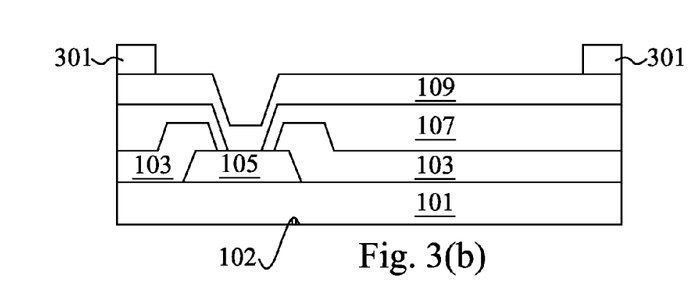

As illustrated in FIG. 3(b), a part of the photoresist layer 301 may be removed to form a first photoresist pattern 301 above the seed layer 109. The remaining first photoresist pattern 301 may cover the two ends of the seed layer 109, leaving the rest of the seed layer 109 uncovered. The first photoresist pattern 301 may comprise a surface with a right angle as shown in FIG. 3(b). Alternatively, the first photoresist pattern 301 may comprise a smooth surface without a right angle.

Figure 3C:
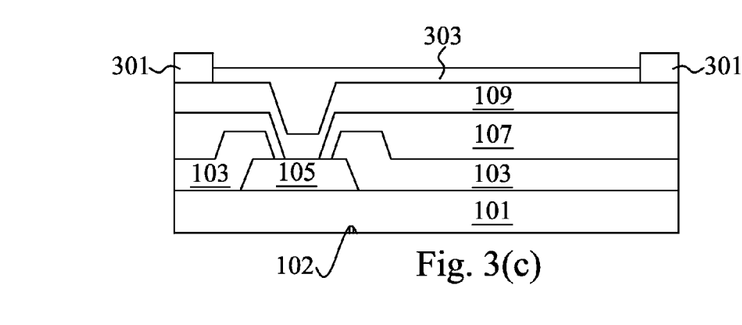

As illustrated in FIG. 3(c), a second photoresist pattern 303 may be formed above the seed layer 109 in the area uncovered by the first photoresist pattern 301 and surrounded by the first photoresist pattern 301. The second photoresist pattern 303 is formed by covering the whole surface of the seed layer 109 with a thin layer (such as 1 micron) photoresist material, usually by spin-coating. If excessive photoresist pattern 303 is formed, the excessive part can be removed by exposing the photoresist pattern 303 to light (usually UV) through a stencil, or mask, that is designed to allow light to fall only on desired places. The light causes a chemical change in the exposed region. Depending on the system, it is possible to wash away the either the exposed or unexposed regions selectively. After the excessive part of the photoresist pattern 303 is removed to ensure a surface of the second photoresist pattern 303 is below a surface of the first photoresist pattern 301.

Figure 3D:
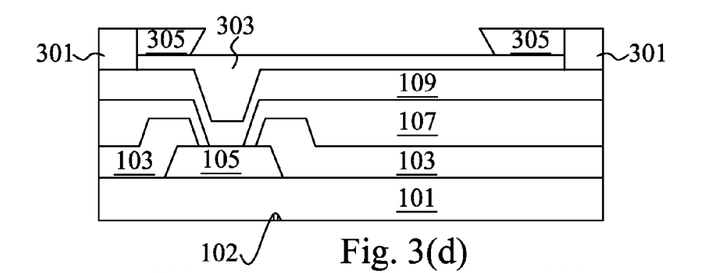
Figure 3E:
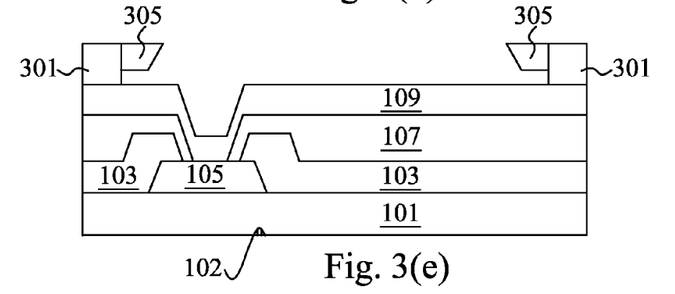

As illustrated in FIG. 3(d), a third photoresist pattern 305 may be formed above the second photoresist pattern 303 and connected to the first photoresist pattern 301. The third photoresist pattern 305 may be formed usually by spin-coating with the same material as the material for the first photoresist pattern 301, while the material for the second photoresist pattern 303 may be different. The second photoresist pattern 303 is a sacrificial layer, which will be removed completely. The material for the second photoresist pattern 303 may be boro-phospho silicate glass (BPSG), phosphosilicate glass (PSG), poly-si, low-pressure chemical-vapor-deposited silicon dioxide, or some other photoresist material. The choice of the material for the sacrificial layer second photoresist pattern 303 may depend on the material used for the seed layer 109 as well. As illustrated in FIG. 3(e), the second photoresist pattern 303 may be removed while leaving the first photoresist pattern 301 and the third photoresist pattern 305 intact. The material for the third photoresist pattern 305 may comprise some photo active compound (PAC). PAC is a special kind of polymer and it is a solvent type, and the PAC decreases light intensity from top to bottom. The third photoresist pattern 305 may comprise a surface with an acute angle 401 as shown in FIG. 3(d). The acute angle 401 may be formed by changing the light intensity above the surface of the third photoresist pattern 305. For example, the light intensity above the point 403, which is close to the corner of the acute angle 401, may be higher than the light intensity above the point 405, which is close to the bottom of the acute angle 401. The higher intensity light above the point 403 may remove more PR material mixed with PAC below the point 403, compared to the lower intensity light above the point 405. Therefore an acute angle 401 is formed. Other shapes such as a curve shape may be formed as well by changing and programming the light intensity at various points along the curved surface.

Figure 3F:
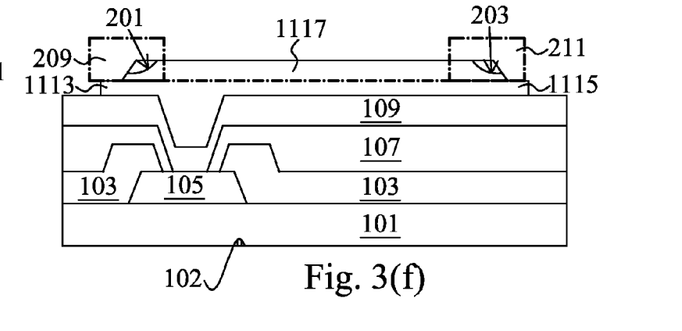

As illustrated in FIG. 3(f), a RDL 111 may be formed filling the areas not covered by by the first photoresist pattern 301 and the third photoresist pattern 305. The RDL 111 may be formed with a conductive material selected from the group consisting essentially of Ti, Al, Ni, nickel vanadium (NiV), Cu, a Cu alloy, and combinations thereof. The RDL 111 covers the opening of the passivation layer, and electrically connected to the contact pad 105 through the seed layer 109. The first photoresist pattern 301 and the third photoresist pattern 305 may be removed after the RDL 111 is formed.

The RDL 111 may comprise two parts. A first part of the RDL 111 fills an area not covered by the first photoresist pattern 301 above and in contact with the seed layer 109, covering the opening of the passivation layer 103, and electrically connected to the contact pad 105 through the seed layer. A second part of the RDL 111 is above the first part of the RDL 111 filling an area not covering by the third photoresist pattern 305, wherein the second part of the RDL has end portions 209 and 211 next to the third photoresist pattern 305, and the end portions 209 and 211 have a surface that is smooth without a right angle. In the embodiment shown in FIG. 3(f), the end portions 209 and 211 have a surface with an obtuse angle 201 and 203 respectively. Alternatively, any other forms of top surface that is smooth without a right angle may be formed similarly, which are not shown in FIGS. 3(a)-3(h).

Figure 3G:
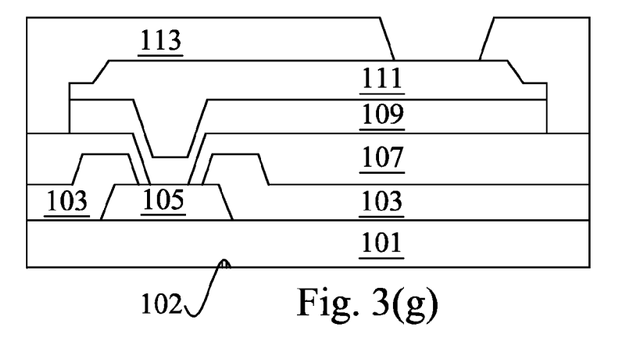
Figure 3H:
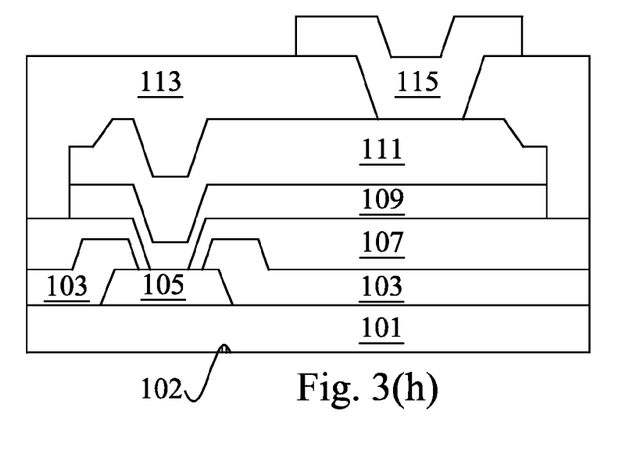

As illustrated in FIG. 3(g), a second insulating layer 113 may be formed above the RDL 111. An opening may be formed within the second insulating layer 113 to expose the RDL 111. As illustrated in FIG. 3(h), an UBM pad 115 maybe formed within the opening of the second insulating layer 113 and in contact with the RDL 111.

However, while FIGS. 2(a)-2(e) and FIGS. 3(a)-3(h) illustrate embodiments of methods that may be used to shape the RDL 111 as described, these embodiments are merely intended to be illustrative of ways that may be used, and are not intended to be limiting upon the embodiments. Rather, any suitable method for shaping the RDL 111, such as forming the RDL 111 and then shaping the RDL 111 using, e.g., an etching process (such as the etching processes described in U.S. Pat. No. 6,440,865 to Lee, which is hereby incorporated herein by reference), may alternatively be utilized. All such methods are fully intended to be included within the scope of the embodiments.

The embodiments of the present disclosure have several advantageous features. The embodiments of the package device have a RDL with end portions having a top surface that is smooth without a right angle so that stress concentration at the RDL can be reduced, compared to the conventional top surface with a right angle at the end portions of the RDL. The reliability of the package device is therefore improved.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a package device comprising:
   providing a substrate with a contact pad on a surface of the substrate;
   forming a dielectric layer on the surface of the substrate with an opening exposing the contact pad;
   forming a seed layer above the dielectric layer, covering the opening of the dielectric layer, covering and in contact with the contact pad;
   forming a photoresist layer above the seed layer, with a photoresist material comprising photo active compound (PAC);
   forming a photoresist pattern above the seed layer covering two ends of the seed layer;
   forming a conductive layer in an area not covering by the photoresist pattern above and in contact with the seed layer, covering the opening of the dielectric layer, and electrically connected to the contact pad through the seed layer, wherein the conductive layer has an end portion next to the photoresist pattern, and the end portion of the conductive layer has a top surface that is smooth without a right angle; and
   removing the photoresist pattern.

2. The method of claim 1, wherein:
   forming the photoresist pattern above the seed layer comprises forming the photoresist pattern having a surface with an acute angle; and
   forming the conductive layer in an area not covering by the photoresist pattern comprises forming the conductive layer with the end portion next to the photoresist pattern, the end portion of the conductive layer has a top surface with an obtuse angle.

3. The method of claim 1, wherein:
   forming the photoresist pattern above the seed layer comprises:
     forming a first photoresist pattern above the seed layer;
     forming a second photoresist pattern above the seed layer and surrounded by the first photoresist pattern, wherein a surface of the second photoresist pattern is below a surface of the first photoresist pattern;
     forming a third photoresist pattern connected to the first photoresist pattern and above the second photoresist pattern; and removing the second photoresist pattern while leaving the first photoresist pattern and the third photoresist pattern intact; and forming the conductive layer in an area not covering by the photoresist pattern comprising:

forming a first part of the conductive layer filling an area not covering by the first photoresist pattern above and in contact with the seed layer, covering the opening of the dielectric layer, and electrically connected to the contact pad through the seed layer; and forming a second part of the conductive layer above the first part of the conductive layer filling an area not covering by the third photoresist pattern, wherein the second part of the conductive layer has an end portion next to the third photoresist pattern, and the end portion has a top surface that is smooth without a right angle.

4. The method of claim 1, further comprising:
forming a first insulating layer between the dielectric layer and the seed layer.

5. The method of claim 1, further comprising:
forming a second insulating layer above the conductive layer after removing the photoresist pattern;
forming an opening of the second insulating layer to expose the conductive layer; and
forming an under bump metallization (UBM) pad within the opening of the second insulating layer and in contact with the conductive layer.

6. The method of claim 1, wherein forming the seed layer above the dielectric layer comprises forming the seed layer with a conductive material selected from the group consisting essentially of Cu, Ti, TiN, Ta, TaN, Cr, CrN, W, WN, and combinations thereof.

7. The method of claim 1, wherein forming the conductive layer comprises forming the conductive layer with a conductive material selected from the group consisting essentially of Ti, Al, Ni, nickel vanadium (NiV), Cu, a Cu alloy, and combinations thereof.

8. A method for forming a package device comprising:
forming over an integrated circuit a contact pad electrically connected to at least one active device of the integrated circuit;
depositing insulating material over the contact pad;
forming in the insulating material an opening, the opening at least partially aligned with the contact pad;
depositing conductive material over the insulating material and in the opening to form a post-passivation interconnect (PPI) line, the PPI line being in physical contact with the contact pad and having a first edge and a second edge, wherein at least one of the first edge and the second edge is laterally displaced from the opening;
forming at least one of the first edge and the second edge to have a profile selected from the group consisting of a curved surface and an obtuse angle;
depositing another insulating material over the PPI line; and
electrically connecting the PPI line to a connector.

9. The method of claim 8, wherein the step of depositing insulating material over the contact pad comprises depositing a passivation layer over the integrated circuit and depositing an insulating layer over the passivation layer.

10. The method of claim 9, wherein:
the contact pad has a top surface with a first lateral dimension;
the opening extends through the passivation layer with a second lateral dimension smaller than the first lateral dimension; and
the opening extends through the insulating layer with a third lateral dimension smaller than the second lateral dimension.

11. The method of claim 8, wherein the steps of depositing conductive material over the insulating material and in the opening to form a post-passivation interconnect (PPI) line, and of forming at least one of the first edge and the second edge to have a profile selected from the group consisting of a curved surface and an obtuse angle include:
depositing a seed layer on the insulating material;
forming a photoresist layer on the seed layer;
patterning the photoresist layer to include a photoresist opening, the photoresist opening having a sidewall forming an acute angle; and
filling the photoresist opening with a conductive layer, the conductive layer having at least one edge having a profile with an obtuse angle.

12. The method of claim 11, wherein the at least one edge of the conductive layer is aligned with a corresponding edge of the seed layer.

13. The method of claim 11, wherein the step of patterning the photoresist layer to include a photoresist opening, comprises:
exposing the photoresist layer to an exposure light; and
adjusting intensity of the exposure light during the exposing process.

14. The method of claim 8, wherein the steps of depositing conductive material over the insulating material and in the opening to form a post-passivation interconnect (PPI) line and of forming at least one of the first edge and the second edge to have a profile selected from the group consisting of a curved surface and an obtuse angle include:
depositing a seed layer on the insulating material;
depositing a patterned conductive layer on the seed layer, the patterned conductive layer having a first straight edge having a planar profile and a second straight edge having a planar profile; and
etching at least one of the first straight edge and the second straight edge to have a curved surface profile.

15. The method of claim 8, wherein the steps of depositing conductive material over the insulating material and in the opening to form a post-passivation interconnect (PPI) line, and of forming at least one of the first edge and the second edge to have a profile selected from the group consisting of a curved surface and an obtuse angle include:
depositing a seed layer on the insulating material;
forming a first photoresist layer on the seed layer;
patterning the first photoresist layer to include a first photoresist opening, the first photoresist opening exposing the opening;
filling the opening and partially filling the first photoresist opening with a sacrificial layer;
forming another photoresist layer over the patterned first photoresist layer and the sacrificial layer;
patterning the another photoresist layer to have an another photoresist opening, the another photoresist opening being contained within a perimeter of the first photoresist opening and having a sidewall forming an acute angle;
removing the sacrificial layer to from within the first photoresist opening and from beneath the another photoresist to form a cavity extending partially beneath the another photoresist layer; and
filling the first photoresist opening and the cavity with a conductive layer to form a post-passivation interconnect (PPI) line, the PPI line having the first edge and the second edge, wherein at least one of the first edge and the second edge has a profile including a first part proximate the seed layer having a right angle and a second part distal the seed layer having the obtuse angle.

16. The method of claim 15, wherein the step of patterning the another photoresist layer includes:
   exposing an upper portion of the photoresist layer to an exposure light having a first intensity; and
   exposing a lower portion of the another photoresist layer to an exposure light having a second intensity, lower than the first intensity.

17. A method for forming a package device comprising:
   forming a contact pad on a surface of a substrate;
   depositing a dielectric layer over the surface of the substrate with an opening exposing the contact pad;
   forming a patterning layer above the dielectric layer, the patterning layer including a second opening at least partially aligned with the opening in the dielectric layer, the second opening including a sidewall having an acute angle relative a top surface of the substrate; and
   filling the second opening with a conductive material to form a line, the line including an edge having an obtuse angle corresponding to the acute angle of the patterning layer.

18. The method of claim 17, wherein the step of forming a patterning layer above the dielectric layer includes:
   depositing a photoresist layer above the dielectric layer; and
   exposing portions of the photoresist layer to light;
   adjusting intensity of the light during the exposing step; and
   developing the photoresist to remove a part of the photoresist layer.

19. The method of claim 18 further comprising adjusting the intensity of the light during the exposing step to provide a first light intensity while exposing top portions of the photoresist layer and a second light intensity lower than the first light intensity while exposing bottom portions of the photoresist layer.

20. The method of claim 17, wherein the step of forming a patterning layer above the dielectric layer includes:
   depositing seed layer above the dielectric layer;
   depositing a first photoresist layer above the seed layer;
   patterning the first photoresist layer to include a first photoresist opening, the first photoresist at least partially aligned with the opening in the dielectric layer;
   filling the opening in the dielectric layer and partially filling the first photoresist opening with a second photoresist layer;
   forming a third photoresist layer over the patterned first photoresist layer and the second photoresist layer;
   patterning the third photoresist layer by exposing portions of the third photoresist layer to a varying intensity of light and removing the exposed portions of the third photoresist layer to form a third photoresist opening contained within a perimeter of the first photoresist opening and having a sidewall forming an acute angle;
   removing the second photoresist layer from within the first photoresist opening and from beneath the third photoresist layer to form a cavity extending partially beneath the third photoresist layer; and
   filling the third photoresist opening, the first photoresist opening, and the cavity with a conductive layer to form the line, the line having a profile including a first part proximate the seed layer having a right angle and a second part distal the seed layer having the obtuse angle, the obtuse angle corresponding to the acute angle of the sidewall of the third photoresist layer; and
   removing the patterned first photoresist layer and the patterned third photoresist layer.

* * * * *